(12) United States Patent  (10) Patent No.: US 7,317,311 B2
Inoue  (45) Date of Patent: Jan. 8, 2008

(54) WAFER HANDLING CHECKER

(75) Inventor: Hirohito Inoue, Miyazaki (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/701,471

(22) Filed: Nov. 6, 2003

(65) Prior Publication Data

US 2004/0152314 A1 Aug. 5, 2004

(30) Foreign Application Priority Data

Feb. 4, 2003 (JP) ............................. 2003-027458

(51) Int. Cl.
G01R 31/28 (2006.01)
(52) U.S. Cl. .................................. 324/158.1
(58) Field of Classification Search ............. 324/158.1; 206/710–711; 414/331.15, 941; 434/219, 434/224, 433; 700/218
See application file for complete search history.

(56) References Cited

U.S. PATENT DOCUMENTS 5,258,047 A * 11/1993 Tokisue et al. ............. 29/25.01
5,645,391 A *  7/1997 Ohsawa et al. ........ 414/416.03
5,777,485 A *  7/1998 Tanaka et al. ............... 324/757
5,929,766 A *  7/1999 Rochet et al. ........... 340/686.2
6,097,492 A     8/2000 Kondo et al.
6,229,118 B1 *  5/2001 Kim et al. ................ 219/444.1
6,459,285 B1 * 10/2002 Okabe ........................ 324/754
6,540,467 B1 *  4/2003 Zohni et al. ................. 414/275

FOREIGN PATENT DOCUMENTS

JP        7-74276    3/1995
JP        8-23022    1/1996
JP     2000-49212    2/2000

* cited by examiner

*Primary Examiner*—Ha Tran Nguyen
*Assistant Examiner*—Roberto Velez
(74) *Attorney, Agent, or Firm*—Wenderoth, Lind & Ponack, L.L.P.

(57) ABSTRACT

A plurality of wafers each having a conductive film on each face thereof are housed in slots of a cassette, and a potential of "H" level is applied from a control box to each wafer via an electrode. A conductive suction part of a vacuum pincette is connected to a grounding potential. A LED corresponding to the wafer to be operated on is lit up by a specification from a computer so that an operator operates on the wafer specified by the computer using the vacuum pincette. The control box detects the potential of each electrode and decides as to whether a given wafer is correctly operated on or not. In the case of erroneous operation, such an erroneous operation is displayed by means of a buzzer, and an overall result of operation is stored in the computer.

8 Claims, 2 Drawing Sheets

WAFER HANDLING CHECKER

BACKGROUND OF THE INVENTION

1. Field of the Invention

The invention relates to a wafer handling checker for checking up an operation state of a semiconductor wafer.

2. Description of Related Art

An operation training of wafers in fabrication of semiconductor devices has been generally conventionally performed in the manner that genuine wafers housed in each slot of a cassette are transferred by an operator to be trained (hereinafter referred to as trainee) and the surfaces of the transferred wafers are inspected, thereby checking up the increased number of defects such as flaw and the like to measure the degree of advancement of the operation.

However, according to the conventional method of operation training of wafers, it was necessary that the number of defects of the wafers is inspected before the operation of the wafers, and the number of defects of the wafers was inspected again after the operation of the wafers, thereby checking up the number of defects which was increased during the operation of the wafers. Accordingly, there were problems that not only an enormous quantity of work and time were required for inspecting the wafers but also a material cost increased because it was difficult to recycle the wafers which suffered big damages, and hence such damaged wafers had to be disposed of.

SUMMARY OF THE INVENTION

To solve the problems of the prior art, a wafer handling checker of the invention comprises a plurality of operation training wafers, for example, to which a conductive film is applied on the face thereof, a cassette having a plurality of slots in which the plurality of wafers are housed, and a plurality of electrodes which contact the plurality of wafers when the plurality of wafers are inserted into the plurality of slots, a pincette having a conductive suction part for operating the plurality of wafers, voltage application means for applying a voltage between the respective electrodes of the cassette and the suction part of the pincette, and state detection means for detecting contact between the pincette and each wafer by detecting potentials of the respective electrodes of the cassette or a current flowing to the electrodes.

Since the wafer handling checker is structured as set forth above according to the invention, the operation training of the wafers can be performed in the following manner.

The plurality of operation training wafers are inserted into the slots of the cassette for housing the wafers. As a result, respective wafers contact respective electrodes provided in respective slots. When a trainee who operates the wafer allows the suction part of the pincette to contact the wafer housed in the cassette, a current flows between the electrode and the suction part which corresponding thereto via the contacted wafer owing to a voltage applied from the voltage application means. A potential of each electrode or a current flowing to each electrode is detected by the state detection means, thereby detecting the state of contact between the pincette and the wafer.

PREFERRED EMBODIMENT OF THE INVENTION

Figure 1:
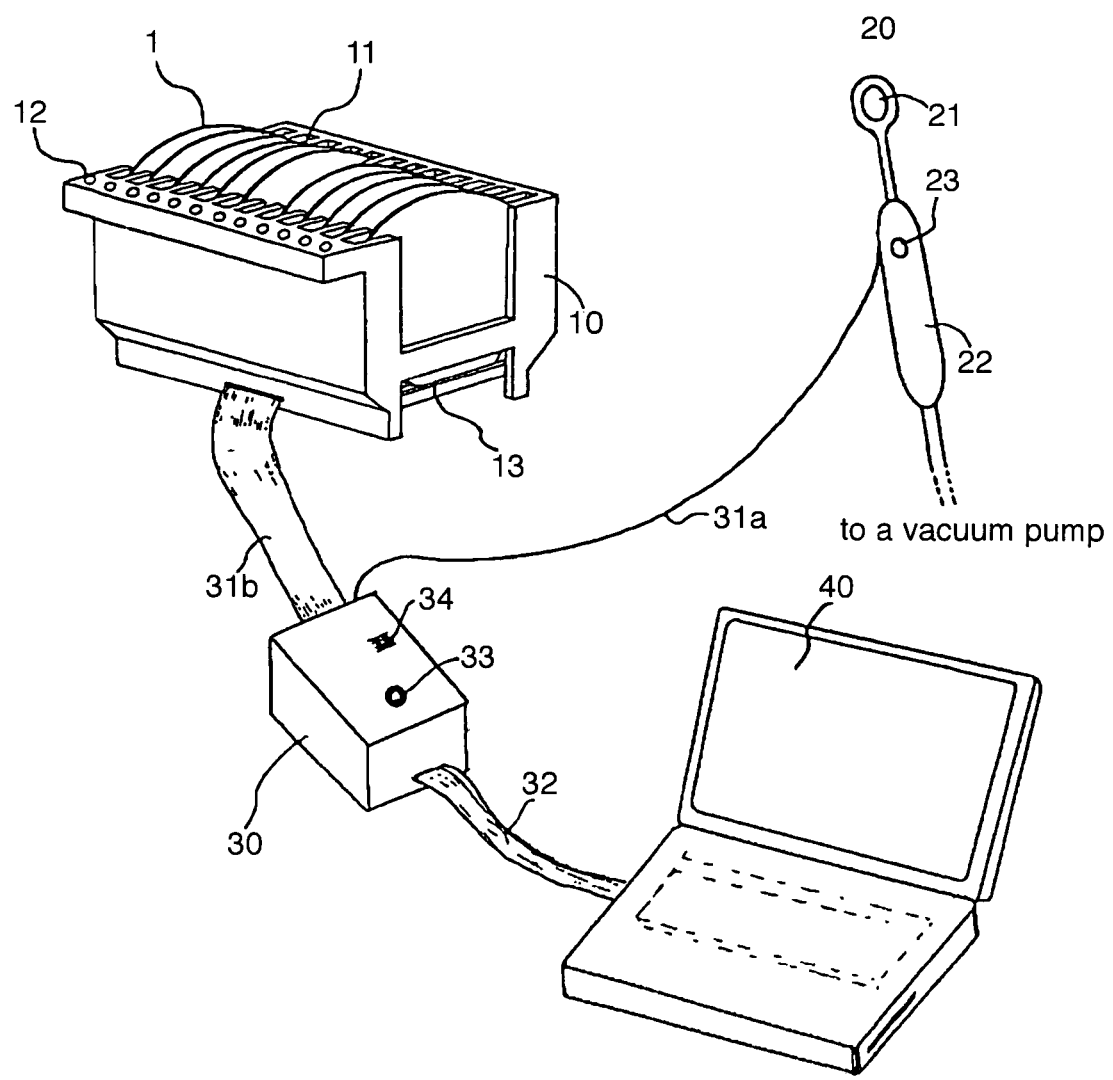
FIG. 1 is a view showing a conceptual diagram of a wafer handling checker according to an embodiment of the invention.

FIG. 1 is a view showing a conceptual diagram of a wafer handling checker according to an embodiment of the invention.

The wafer handling checker comprises a cassette 10 made of an insulating material for transporting wafers and in which a plurality of wafers 1a, 1b, . . . , 1n are housed, a vacuum pincette 20 for taking out the wafers 1a to 1n one by one from the cassette 10 to transfer the taken out wafer, a control box 30, and a computer 40. The wafers 1a to 1n are exclusively used for operation training of the wafers and they are formed of a semiconductor wafer to which a conductive film such as gold is applied on the entire face thereof.

There are provided slots 11a, 11b, . . . , 11n in the cassette 10 by partitioning the cassette 10 for housing the wafers 1a to 1n therein. Display means 12a, 12b, . . . , 12n (e.g. light emitting diodes (hereinafter referred to as LEDs) are attached to an upper portion of the cassette 10 corresponding to the slots 11a, 11b, . . . , 11n for specifying the wafer to be operated. There are provided electrodes 13a, 13b, . . . , 13n on bottom portions of the slots 11a to 11n so as to contact the wafers inserted into these slots 11a to 11n, thereby individually pulling up the potential of respective wafers to a power supply potential (level "H").

The vacuum pincette 20 comprises a suction part 21 having an opening, a handle grip 22 and a vacuum pump, not shown. The suction part 21 is allowed to contact the wafer 1 at the opening side and the inside of the opening is made in a vacuum state by the suction from the vacuum pump, thereby sucking the wafer 1. The handle grip 22 is a part to be gripped by an operator when operating the wafer, and a switch 23 is provided on the handle grip 22 for operating the vacuum state of the suction part 21. A conductive film such as gold is applied to the surface of the suction part 21 and it is connected to a grounding potential (level "L") via a signal line 31a drawn out from the control box 30.

The control box 30 controls a signal control between the cassette 10, the vacuum pincette 20 and the computer 40, and it is connected to the vacuum pincette 20 via the signal line 31a, to the cassette 10 via a signal line 31b and to the computer 40 via an interface cable 32. A switch 33 and a buzzer 34 are provided in the control box 30, and a control circuit for controlling the cassette 10 and monitoring the state of the cassette 10 and the like is housed in the control box 30.

The switch 33 is pushed by the trainee when the trainee to operate the wafers receives a next operation specification after the transferring operation of the specified wafer is completed. The buzzer 34 informs the trainee of an erroneous operation by sounding when the trainee erroneously selects another wafer or makes the specified wafer contact the other wafers at the time of wafer transferring operation.

The computer 40 specifies the control box 30 the sequence of the operation training or stores the result of training.

Figure 2:
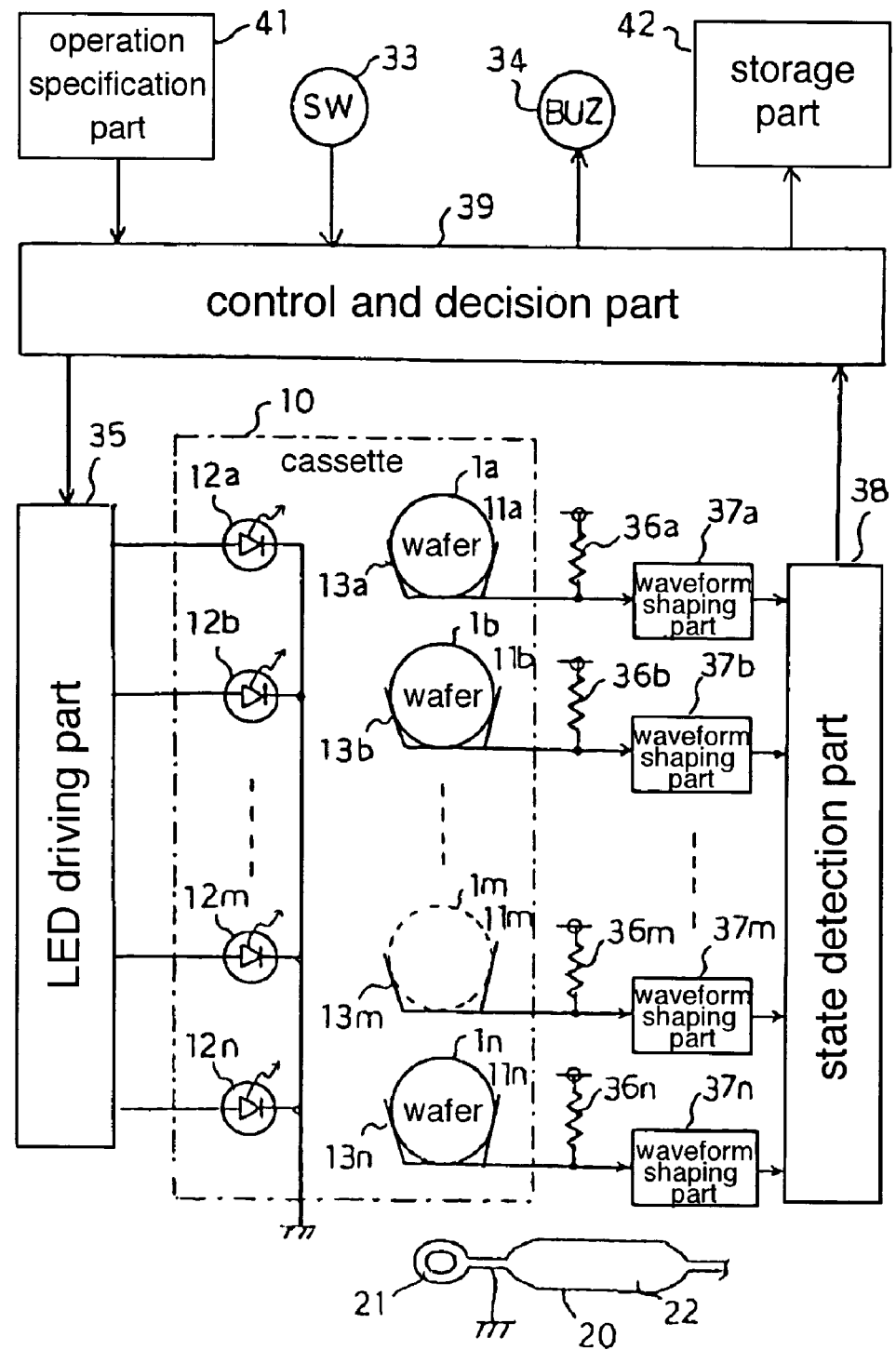
FIG. 2 is a schematic view showing a configuration of the wafer handling checker in FIG. 1.

FIG. 2 is a schematic view showing a configuration of the wafer handling checker in FIG. 1.

The wafer handling checker has an LED driving part 35 for driving the LEDs 12a to 12n of the slots 11a to 11n of the cassette 10. The wafer handling checker further includes voltage application means (e.g. pull-up resistors) 36a, 36b, ..., 36n for pulling up the electrodes 13a to 13n to a power supply potential (level "H"), waveform shaping part 37, 37b, ..., 37n for shaping signal waveforms of the electrodes 13a to 13n, and state detection means (e.g. state detection part) 38.

The pull-up resistors 36a to 36n apply a potential "H" to the wafers inserted into the slots 11a to 11n via the electrodes 13a to 13n and allows only the wafer which the vacuum pincette 20 contacted to be in the potential "L", thereby detecting the state of the wafer. The waveform shaping part 37a to 37n remove the improper signals such as chattering and the like which are generated when the vacuum pincette 20 contacts the wafers and outputs a signal for effecting correct state detection. The state detection part 38 is connected to output sides of the waveform shaping part 37, 37b, ..., 37n.

Both the LED driving part 35 and the state detection part 38 are connected to decision means (e.g. control and decision part) 39, and the switch 33 and the output means (e.g. buzzer) 34 are connected to the control and decision part 39. Further, the control and decision part 39 is connected to the computer 40 which operations as an operation specification part 41 and a storage part 42. These LED driving part 35, the state detection part 38 and the control and decision part 39 are respectively housed in the control box 30 as shown in FIG. 1 together with the pull-up resistors 36a to 36n and the waveform shaping part 37a, 37b, ..., 37n.

An operation of the wafer handling checker is described next.

The wafers 1a to 1m for the operation training are inserted into all the slots 11a to 11m of the cassette 10 except a given slot (e.g. the slot 11n) as the preparation of the operation training of the wafer. Further, the control box 30, the computer 40 and the vacuum pincette 20 are respectively activated.

Then, the trainee pushes the switch 33 of the control box 30. The control and decision part 39 reads out operation specification information for specifying a slot (e.g. the slot 11b) in which the wafer to be transferred is inserted by the operation specification part 41 in response to a signal from the switch 33. Further, the control and decision part 39 supplies a driving signal for lighting up the LED 12b corresponding to the wafer 1b to be operated to the LED driving part 35. The LED driving part 35 lights up the LED 12b in response to the driving signal.

The trainee sucks the wafer 1b specified by the LED 12b by the vacuum pincette 20 and takes out the sucked wafer 1b from the slot 11b to transfer it to the vacant slot 11n. The state of transferring of the wafers at this time is monitored one by one by the state detection part 38 based on the potentials of the electrodes 13a to 13n.

That is, when the suction part 21 of the vacuum pincette 20 contacts the specified wafer 1b, since the suction part 21 is connected to the grounding potential, the electrode 13b provided on the slot 11b of the cassette 10 is changed to "L" via the conductive wafer 1b. At this time, the other electrodes 13 remain "H" since they are connected to the power supply potential via the pull-up resistor 36. As a result, the state detection part 38 can detect that the vacuum pincette 20 contacts the specified wafer 1b.

Then, when the wafer 1b is taken out from the slot 11b, the electrode 13b is moved away from the slot 11b and its potential is returned to "H" by the pull-up resistor 36b, and hence the state detection part 38 can detect that the wafer is taken out from the slot 11b.

Further, when the wafer 1b taken out from the slot 11b is inserted into the vacant slot 11n, the electrode 13n provided in the slot 11n is rendered "L" via the conductive wafer and the suction part 21b of the vacuum pincette 20. Accordingly, the state detection part 38 can detect the wafer 1b is transferred from the slot 11b to the slot 11n.

During the transfer of the wafer 1b, if the suction part 21 contacts the other wafer, e.g. the wafer 1i, other than the specified wafer 1b, or the transferring wafer 1b contacts the other wafer 1i, the electrode 13i corresponding to the contacted wafer 1i is rendered "L". The states of the electrodes 13a to 13n are supplied from the state detection part 38 to the control and decision part 39 as operation state information.

The control and decision part 39 compares the operation specification information read out from the operation specification part 41 with the operation state information detected by the state detection part 38, and decides the presence or absence of an erroneous operation. When the control and decision part 39 decides as the erroneous operation, it immediately actuates the buzzer 34 so as to sound, thereby calling the trainee's attention.

Upon completion of the transfer of the specified wafer, the trainee pushes the switch 33 of the control box 30. As a result, the control and decision part 39 reads out the operation specification information, for specifying the wafer to be transferred next, from the operation specification part 41, and the same operations are repeated.

In such a manner, upon completion of a series of operation training of the wafer, information representing the result of training such as the presence or absence and the number of occurrence of the erroneous operation, and operating time and the like is outputted to the storage part 42 and stored therein.

As set forth above, since the wafer handling checker according to the embodiment of the invention employs the wafers 1 for operation training to which a conductive film is deposited on the entire face thereof, the vacuum pincette 20 having the conductive suction part 21, there is an advantage that the operation training state can be checked up within a short period of time with assurance. Further, since the wafers 1 for operation training can be repetitively used, there is an advantage that the cost can be reduced.

The invention is not limited to the foregoing preferred embodiment and can be modified variously. As examples of modification, there are exemplified as follows.

(a) Although each wafer 1 employs a semiconductor wafer to which a conductive film is applied on the entire face thereof, it may be formed of ceramics to which a conductive film is applied or a material having conductive properties to have the same shape as the wafer formed of the semiconductor wafer.

(b) Although the operation state can be detected in response to the change of level of the wafer by use of the vacuum pincette 20 connected to the grounding potential while the wafer 1 is pulled up to "H", a vacuum pincette connected to the power supply potential may be used while the wafer 1 is pulled down to "L". Further, a current flowing between the wafer and the vacuum pincette may be detected.

(c) Although the exclusive control box 30 and the general-purpose computer 40 are combined to structure respective processing parts such as the LED driving part 35, the waveform shaping part 37, the state detection part 38, the control and decision part 39, the operation specification part 41, the storage part 42 and the like, the method of structuring the overall wafer handling checker is optional. That is, these constituents may be integrated with one another as an exclusive controller or the entire structure may be controlled by a software of the general-purpose computer while the control box 30 serves as a merely input/output part.

(d) An input/output equipment such as a keyboard, a speaker and the like may be employed instead of the switch 33 and the buzzer 34.

(e) Although the embodiment is explained in the case where the wafer handling checker is used for the operation training of the wafers by the trainee, in the case where the wafers are transported using a robot, the vacuum pincette 20 is replaced by a robot arm, so that the transportation state of the wafers can be checked up by the robot.

(f) The robot which is accurately adjusted in the above item (e) can be used for detecting the deformation of the cassette 10.

As mentioned in detailed above, according to the first and second aspects of the invention, there are provided the cassette for housing the conductive operation training wafers, and having electrodes for applying the voltage to the wafers, and the state detection means for detecting that the conductive suction part of the pincette contacts each wafer housed in the cassette. As a result, the handing state of the wafers can be easily and quickly known.

According to the third aspect of the invention, there is provided the decision means for deciding the presence or absence of erroneous operation in response to a result of detection by the state detection means and the operation specification information. As a result, it is possible to decide the degree of advancement of the wafer operation training in addition to the effect of the first aspect of the invention.

According to the fourth aspect of the invention, there is provided the output means for generating sound when the decision means decides the presence of erroneous operation. As a result, the trainee of operation training can know the erroneous operation on the moment, thereby enhancing the learning effect.

What is claimed is:

1. A wafer handling checker comprising: a plurality of training operation wafers each formed of a semiconductor or ceramic material to which a conductive film or a material having conductive properties is applied on a face thereof; a cassette having a plurality of slots for housing the plurality of training operation wafers, and a plurality of electrodes for contacting the plurality of training operation wafers when the plurality of training operation wafers are inserted into the plurality of slots; a vacuum pincette having a conductive suction part for operating on the plurality of training operation wafers; voltage application means for applying a voltage between each electrode of the cassette and the conductive suction part of the vacuum pincette; and state detection means for detecting which of the plurality of training operation wafers housed in the cassette the vacuum pincette is in contact with by detecting a potential of each electrode of the cassette or a current flowing to an electrode of the cassette associated with the contacted training operation wafer.

2. The wafer handling checker according to claim 1, wherein the cassette has display means for specifying a training operation wafer to be operated on based on operation specification information.

3. The wafer handling checker according to claim 2, further comprising decision means for deciding whether an erroneous operation occurs based on a result of detection by the state detection means and the operation specification information.

4. The wafer handling checker according to claim 3, wherein the decision means has output means for generating sound when the decision means decides the erroneous operation has occurred.

5. A wafer handling checker comprising: a plurality of training operation wafers each formed of a semiconductor or ceramic material to which a conductive film or a material having conductive properties is applied on a face thereof; a cassette having a plurality of slots for housing the plurality of training operation wafers, and a plurality of electrodes for contacting the plurality of training operation wafers when the plurality of training operation wafers are inserted into the plurality of slots; a vacuum pincette having a conductive suction part for operating on the plurality of training operation wafers; and a controller configured to apply a voltage between each electrode of the cassette and the conductive suction part of the vacuum pincette, and detect which of the plurality of training operation wafers housed in the cassette the vacuum pincette is in contact with by detecting a potential of each electrode of the cassette or a current flowing to an electrode of the cassette associated with the contacted training operation wafer.

6. The wafer handling checker according to claim 5, wherein the cassette has a display configured to specify a training operation wafer to be operated on based on operation specification information.

7. The wafer handling checker according to claim 6, wherein the controller is further configured to decide whether an erroneous operation occurs based on a result of detection and the operation specification information.

8. The wafer handling checker according to claim 7, wherein the controller is further configured to cause a sound to be generated when the erroneous operation has occurred.

* * * * *